(12) United States Patent
Lawrence et al.

(10) Patent No.: US 11,398,804 B2
(45) Date of Patent: Jul. 26, 2022

(54) VARIABLE-FREQUENCY CHARGE PUMP USING OUTPUT VOLTAGE THRESHOLD CONTROL

(71) Applicant: Cirrus Logic International Semiconductor Ltd., Edinburgh (GB)

(72) Inventors: Jason W. Lawrence, Austin, TX (US);
Eric J. King, Austin, TX (US);
Christian Larsen, Austin, TX (US);
Hasnain Akram, Austin, TX (US);
Eric Kimball, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/986,623

(22) Filed: Aug. 6, 2020

(65) Prior Publication Data

US 2021/0050832 A1 Feb. 18, 2021

Related U.S. Application Data

(60) Provisional application No. 62/886,678, filed on Aug. 14, 2019.

(51) Int. Cl.
*H03G 3/00* (2006.01)
*H03F 3/183* (2006.01)
*H03G 3/30* (2006.01)
*H02M 3/07* (2006.01)
*H03F 1/02* (2006.01)

(52) U.S. Cl.
CPC .............. *H03G 3/004* (2013.01); *H02M 3/07* (2013.01); *H03F 1/0227* (2013.01); *H03F 3/183* (2013.01); *H03G 3/3026* (2013.01); *H03F 2200/03* (2013.01)

(58) Field of Classification Search
CPC .... H03G 3/004; H03G 3/3026; H03G 1/0094; H03F 3/183; H03F 1/0227; H03F 2200/03; H03F 2200/504; H03F 1/0238; H02M 3/07; H02M 1/0012; H02M 1/0025; H02M 1/10; H02M 1/0048; Y02B 70/10
USPC .................... 330/299, 136, 285, 296, 297
See application file for complete search history.

(56) References Cited

U.S. PATENT DOCUMENTS

| 8,311,243 | B2 | 11/2012 | Tucker et al. |
| 2009/0315615 | A1 | 12/2009 | Likhterov |
| 2015/0213844 | A1 | 7/2015 | Nguyen et al. |
| 2016/0308435 | A1 | 10/2016 | de Cremoux |
| 2019/0044437 | A1 | 2/2019 | Tseng et al. |

FOREIGN PATENT DOCUMENTS

EP 1314238 A2 5/2003

OTHER PUBLICATIONS

International Search Report and Written Opinion of the International Searching Authority, International Application No. PCT/US2020/045608, dated Oct. 16, 2020.

*Primary Examiner* — Khanh V Nguyen
*Assistant Examiner* — Khiem D Nguyen
(74) *Attorney, Agent, or Firm* — Jackson Walker L.L.P.

(57) ABSTRACT

A method for operating a charge pump having a variable switching frequency may include comparing a target minimum output voltage with an output voltage generated at an output of the charge pump and controlling switching of switches of the charge pump based on the comparison such that the variable switching frequency varies as an output current driven by the charge pump varies.

19 Claims, 11 Drawing Sheets

VARIABLE-FREQUENCY CHARGE PUMP USING OUTPUT VOLTAGE THRESHOLD CONTROL

CROSS-REFERENCES AND RELATED APPLICATION

The present disclosure claims benefit of U.S. Provisional Patent Application Ser. No. 62/886,678, filed Aug. 14, 2019, which is incorporated by reference herein in its entirety.

FIELD OF DISCLOSURE

The present disclosure relates in general to charge pump power supplies, including without limitation personal audio devices such as wireless telephones and media players, and more specifically, to systems and methods for controlling a variable switching frequency of a charge pump based on a threshold for an output voltage generated by the charge pump.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, for example such as that disclosed in U.S. Pat. No. 8,311,243, in which an indication of the signal level at the output of the circuit is used to control the power supply voltage in a Class-G topology. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode.

In a typical charge pump power supply, a charge pump may operate in accordance with two non-overlapping clock phases of a switching cycle of the charge pump, with different combinations of connections among an input power source to the charge pump (e.g., a battery), a flying capacitor of the charge pump for storing charge, and an output load capacitor which provides the power supply voltage generated by the charge pump.

It can be shown that in a charge pump, resistive power losses may decrease with increased switching frequency while quiescent power losses may increase with increased switching frequency. The sum of these resistive and quiescent losses may have a minimum as a function of switching frequency, and such minimum may represent an optimum frequency at which power losses may be minimized Such optimum frequency may also vary with an output current load driven by the charge pump at its output. However, a charge pump often includes no direct manner in which to measure load current, and adding such current detection circuitry may be costly and impractical.

SUMMARY

In accordance with the teachings of the present disclosure, certain disadvantages and problems associated with power loss in charge pumps may be reduced or eliminated.

In accordance with embodiments of the present disclosure, a method for operating a charge pump having a variable switching frequency may include comparing a target minimum output voltage with an output voltage generated at an output of the charge pump and controlling switching of switches of the charge pump based on the comparison such that the variable switching frequency varies as an output current driven by the charge pump varies.

In accordance with these and other embodiments of the present disclosure, a system for operating a charge pump having a variable switching frequency may include an input configured to receive a signal indicative of an output voltage generated at an output of the charge pump and a control circuit configured to compare a target minimum output voltage with the output voltage generated at the output of the charge pump and control switching of switches of the charge pump based on the comparison such that the variable switching frequency varies as an output current driven by the charge pump varies.

In accordance with these and other embodiments of the present disclosure, a device may include a charge pump having a variable switching frequency and a control circuit configured to compare a target minimum output voltage with an output voltage generated at an output of the charge pump and control switching of switches of the charge pump based on the comparison such that the variable switching frequency varies as an output current driven by the charge pump varies.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
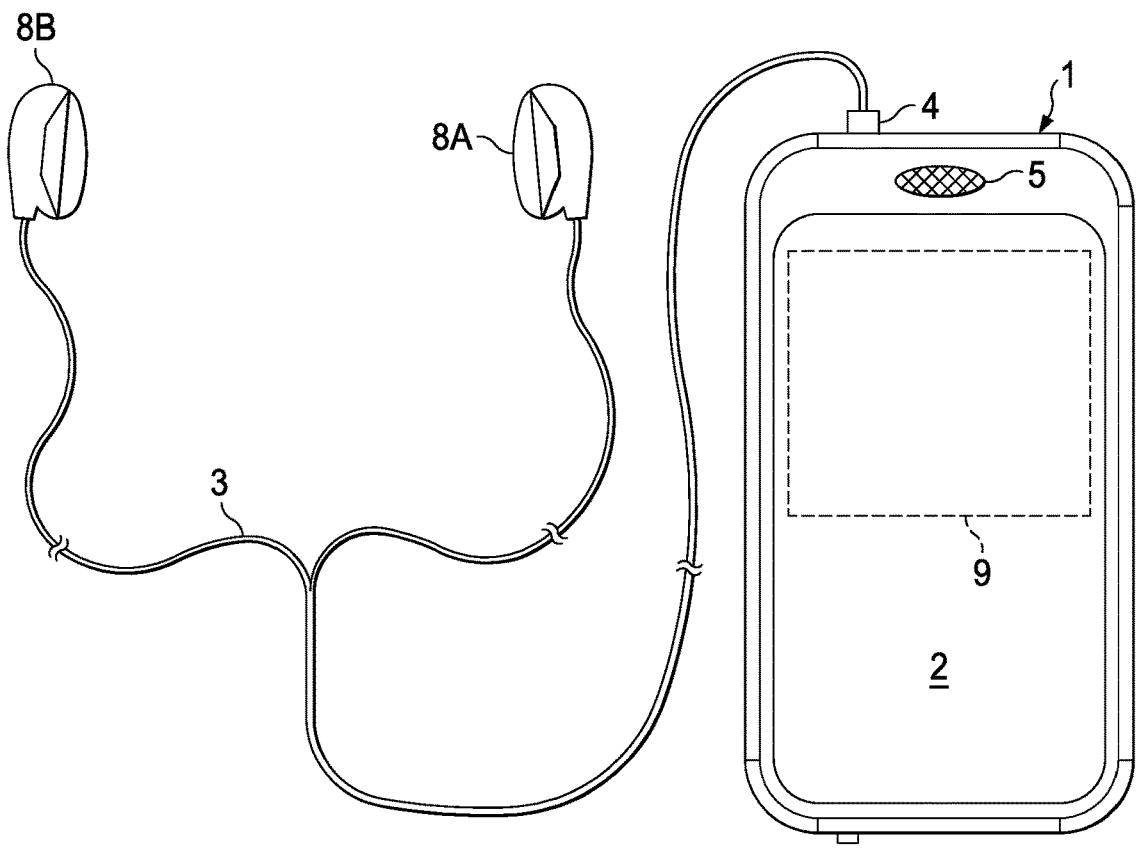
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
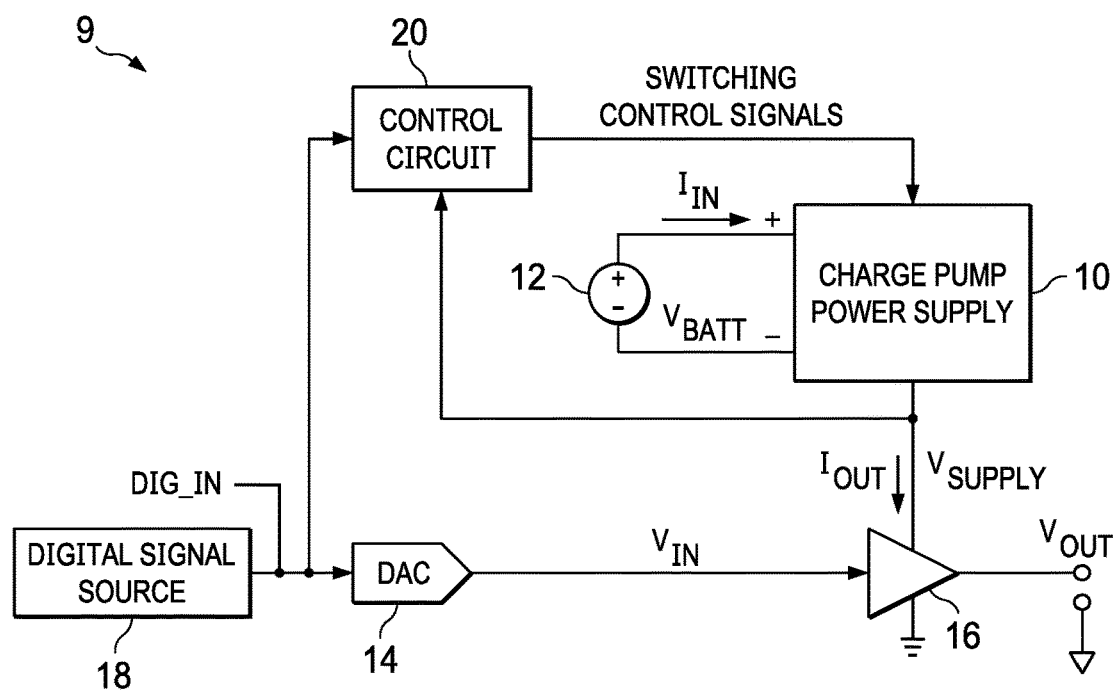
FIG. 2 is a block diagram of selected components of an example integrated circuit, which may be implemented as an audio integrated circuit of the personal audio device depicted in FIG. 1 or any other suitable device, in accordance with embodiments of the present disclosure.

FIG. 2 is a block diagram of selected components of an example IC 9, which may be implemented as audio IC 9 of personal audio device 1 or any other suitable device, in accordance with embodiments of the present disclosure. As shown in FIG. 2, a digital signal source 18 (e.g., a processor, digital signal processor, microcontroller, test equipment, or other suitable digital signal source) may supply a digital input signal DIG_IN to a digital-to-analog converter (DAC) 14, which may in turn convert digital input signal DIG_IN into an equivalent analog input signal $V_{IN}$ and communicate analog input signal $V_{IN}$ to a power amplifier stage 16 which may amplify or attenuate the analog input signal $V_{IN}$ and provide an output signal $V_{OUT}$, which, in embodiments in which digital input signal DIG_IN, analog input signal $V_{IN}$, and output signal $V_{OUT}$ are audio signals, may operate a speaker, headphone transducer, and/or a line level signal output. However, application of IC 9 as depicted in FIG. 2 may not be limited to audio applications, and may be applied to other types of applications, including without limitation vibro-haptic actuators or other actuators. In addition, although amplifier stage 16 is depicted as a single-ended output generating a single-ended audio output signal $V_{OUT}$, in some embodiments, amplifier stage 16 may comprise a differential output, and may thus provide a differential audio output signal $V_{OUT}$.

A charge pump power supply 10 may provide the power supply rail inputs of a supply voltage $V_{SUPPLY}$ to amplifier 16 and may receive a power source input, generally from a battery 12 or other power supply, which may provide an input voltage $V_{BATT}$ to charge pump power supply 10. A control circuit 20 may supply switching control signals (e.g., in the form of pulse-width modulated signals) to charge pump power supply 10 in order to control supply voltage $V_{SUPPLY}$ generated by charge pump power supply 10. Such switching control signals may also define a selected operating mode of charge pump power supply 10 so as to adjust supply voltage $V_{SUPPLY}$ generated by charge pump power supply 10 according to expected and/or actual signal levels at the output of amplifier 16. When low signal levels exist and/or are expected at amplifier output $V_{OUT}$, mode control circuit 20 may improve the power efficiency of audio IC 9 by varying the supply voltage $V_{SUPPLY}$ in conformity with the output signal $V_{OUT}$ or a signal (e.g., digital input signal DIG_IN) indicative of the output signal $V_{OUT}$. Accordingly, to maintain power efficiency, at any given time control circuit 20 may select an operating mode from a plurality of operating modes, each operating mode controlling switches of charge pump power supply 10 with switching control signals to operate charge pump power supply 10 at a different supply voltage, $V_{SUPPLY}$, wherein the supply voltage $V_{SUPPLY}$ in one operational mode may be a rational multiple or ratio of supply voltages of other operational modes.

Figure 3:
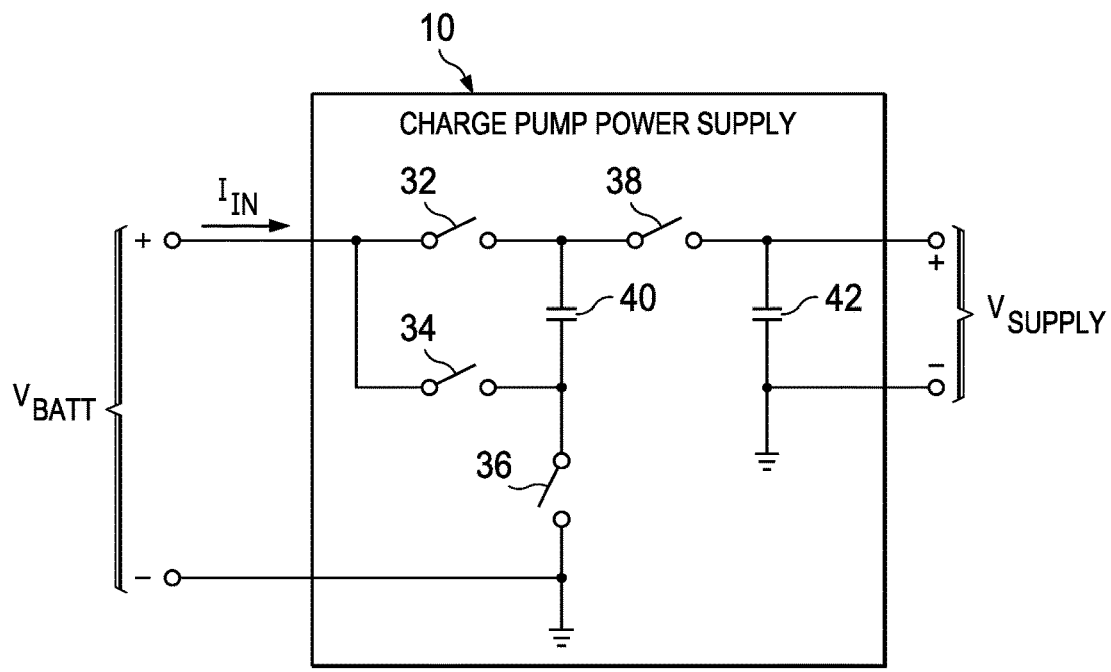
FIG. 3 is a block diagram of selected components of an example charge pump power supply, in accordance with embodiments of the present disclosure.

FIG. 3 is a block diagram of selected components of an example charge pump power supply 10, in accordance with embodiments of the present disclosure. Charge pump power supply 10 as shown in FIG. 3 may be configured to operate in two modes: a first mode in which the supply voltage $V_{SUPPLY}$ output by charge pump power supply 10 is equal to input voltage $V_{BATT}$, and a second mode in which the supply voltage $V_{SUPPLY}$ output by charge pump power supply 10 is equal to two times input voltage $V_{BATT}$. As shown in FIG. 3, charge pump power supply 10 may include switches 32, 34, 36, and 38, a flying capacitor 40, and a charge pump output capacitor 42.

Each switch 32, 34, 36, and 38 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, switching control signals for switches 32, 34, 36, and 38 are not depicted although such control signals would be present to selectively enable and disable switches 32, 34, 36, and 38. In some embodiments, a switch 32, 34, 36, and 38 may comprise an n-type metal-oxide-semiconductor field-effect transistor. In these and other embodiments, a switch 32, 34, 36, and 38 may comprise a p-type metal-oxide-semiconductor field-effect transistor. Switch 32 may be coupled between a positive input terminal of charge pump power supply 10 and a first terminal of flying capacitor 40. Switch 34 may be coupled between the positive input terminal of charge pump power supply 10 and a second terminal of flying capacitor 40. Switch 36 may be coupled between a negative input terminal of charge pump power supply 10 and a second terminal of flying capacitor 40. Switch 38 may be coupled between the first terminal of flying capacitor 40 and a first terminal of charge pump output capacitor 42.

Flying capacitor 40 and charge pump output capacitor 42 may each comprise a passive two-terminal electrical component used to store energy electrostatically in an electric field, which may generate a current in response to a time-varying voltage across the capacitor (or vice versa). Charge pump output capacitor 42 may be coupled between the output terminals of charge pump power supply 10, and thus may store supply voltage $V_{SUPPLY}$ output by charge pump power supply 10.

In the first or "1×" mode, charge pump power supply 10 may operate in a single phase, wherein switch 34 may be disabled and switches 32, 36, and 38 may be enabled during operation, thus charging voltage $V_{SUPPLY}$ on charge pump output capacitor 42 to input voltage $V_{BATT}$. Thus, in the 1× mode, switches of charge pump power supply 10 may not be commutated at a periodic frequency. In the second or "2×" mode, charge pump power supply 10 may sequentially operate in a charging phase in which switches 32 and 36 are enabled and switches 34 and 38 are disabled, allowing charge transfer from battery 12 to flying capacitor 40, and a transfer phase in which switches 32 and 36 are disabled and switches 34 and 38 are enabled, boosting the voltage on flying capacitor 40 and allowing charge transfer from flying capacitor 40 to charge pump output capacitor 42. Because periodic switching of switches of charge pump power supply 10 may be periodically switched during the "2×" phase, it may be desirable to operate such switches at an optimum frequency to reduce the aggregate of resistive and quiescent power losses in charge pump power supply 10, as described in the Background section above.

Although FIG. 3 depicts a particular implementation of a charge pump power supply 10 configured to switch between a first mode in which the boost ratio of supply voltage $V_{SUPPLY}$ and input voltage $V_{BATT}$ is 1, and a second mode in which the boost ratio of supply voltage $V_{SUPPLY}$ and input voltage $V_{BATT}$ is 2, the systems and methods herein may generally apply to charge pump power supplies having more than two modes of operation and/or boost ratios other than 1 or 2 (e.g., 1.5, 3, etc.). In addition, although FIG. 3 depicts a particular implementation of a charge pump power supply 10 having switches 32-38, a single flying capacitor 40, and a charge pump output capacitor 42, the systems and methods herein may generally apply to charge pump power supplies having any suitable topology of switches, one or more flyback capacitors, and one or more load capacitors.

To operate charge pump power supply 10 at an optimum frequency in the 2× mode such that power losses are minimized, control circuit 20 may determine switching times for switches of charge pump power supply 10 based on a threshold of supply voltage $V_{SUPPLY}$ generated by charge pump power supply 10. Such definition of a threshold of supply voltage $V_{SUPPLY}$ may in turn cause control circuit 20 to operate charge pump power supply 10 at a variable switching frequency in order to minimize power losses, as described in greater detail below.

Figure 4A:
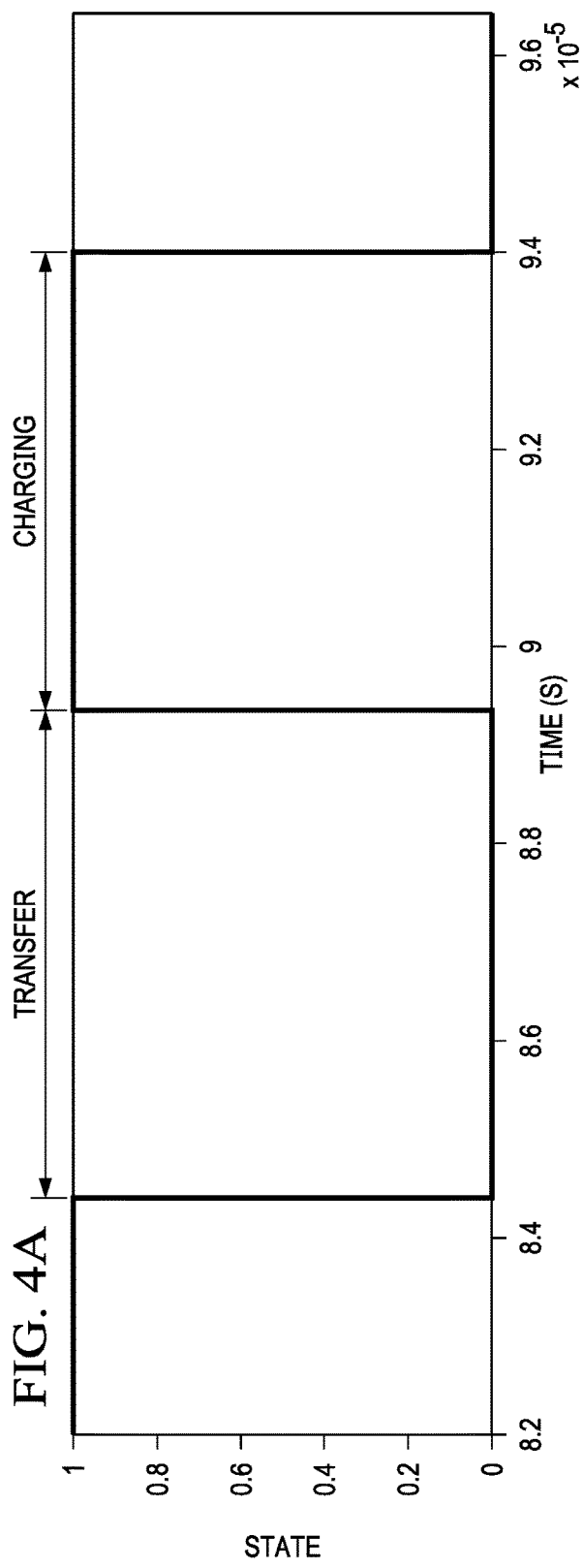
FIGS. 4A and 4B are illustrations of graphs of selected waveforms versus time depicting operation of a charge pump power supply during transfer and charging phases of the charge pump power supply, in accordance with embodiments of the present disclosure.
Figure 4B:
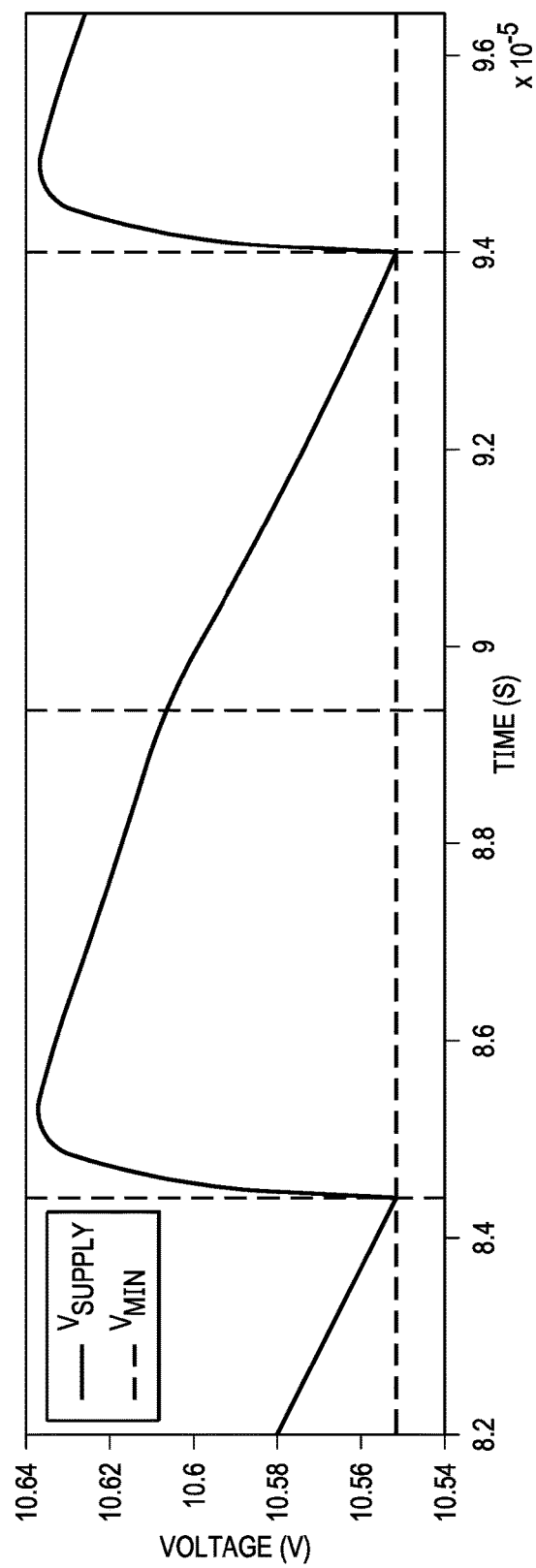

FIGS. 4A and 4B are illustrations of graphs of selected waveforms versus time depicting operation of charge pump power supply 10 during transfer and charging phases of charge pump power supply 10, in accordance with embodiments of the present disclosure. FIG. 4A depicts a switching control signal generated by control circuit 20 (digitized as "0" or "1") over time switching between the transfer phase and charging phase of charge pump power supply 10. FIG. 4B depicts supply voltage $V_{SUPPLY}$ generated by charge pump power supply 10 over a switching cycle of charge pump power supply 10, showing an increase of supply voltage $V_{SUPPLY}$ at the beginning of the transfer phase, followed by a decrease in supply voltage $V_{SUPPLY}$ through the transfer phase and the charging phase, until supply voltage $V_{SUPPLY}$ decreases to a minimum voltage $V_{MIN}$, at which voltage charge pump power supply 10 may switch from the charging phase to the transfer phase.

Figure 5A:
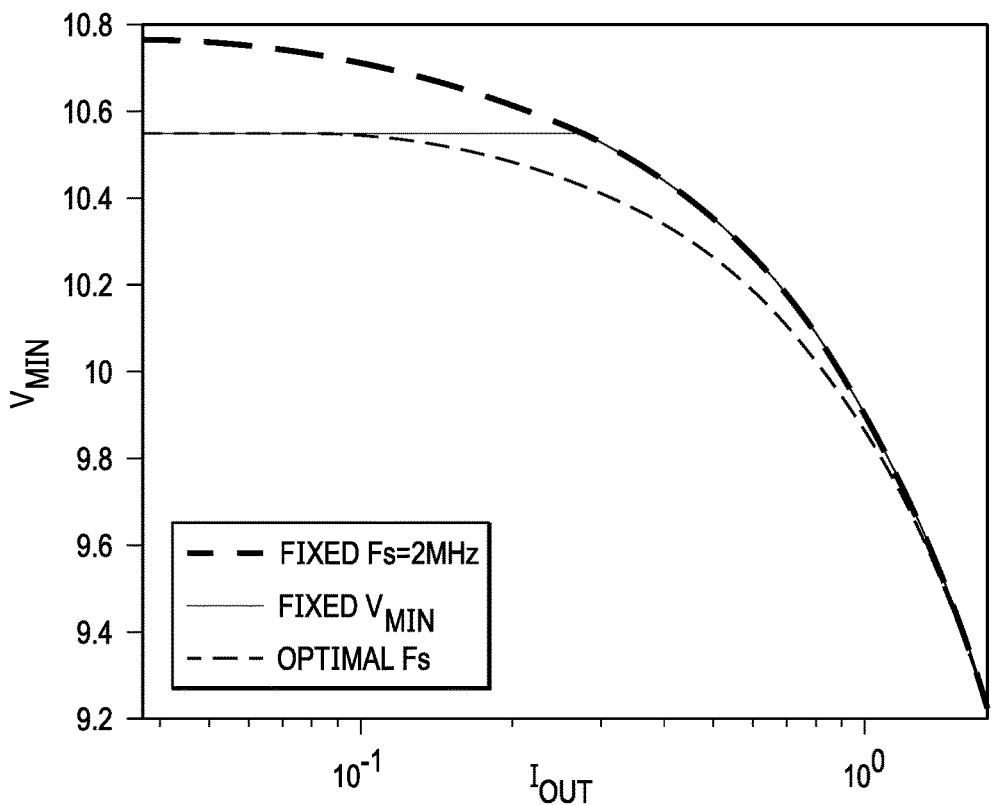
FIGS. 5A, 5B, 5C, and 5D are illustrations of graphs of selected waveforms versus output current generated by a charge pump power supply, in accordance with embodiments of the present disclosure.

FIGS. 5A-5D are illustrations of graphs of selected waveforms versus an output current $I_{OUT}$ generated by charge pump power supply 10, in accordance with embodiments of the present disclosure. FIG. 5A depicts variation in minimum voltage $V_{MIN}$ versus output current $I_{OUT}$ for three different cases: (a) a fixed switching frequency $F_s$ (e.g., $F_s$=2

Figure 5B:
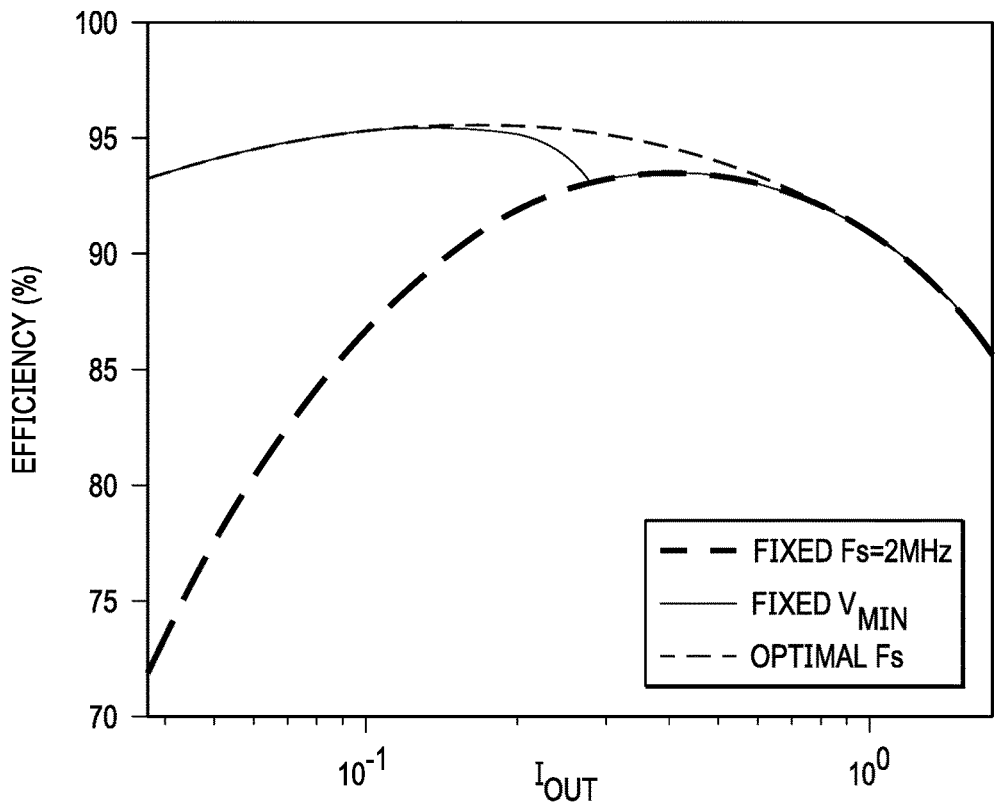
Figure 5C:
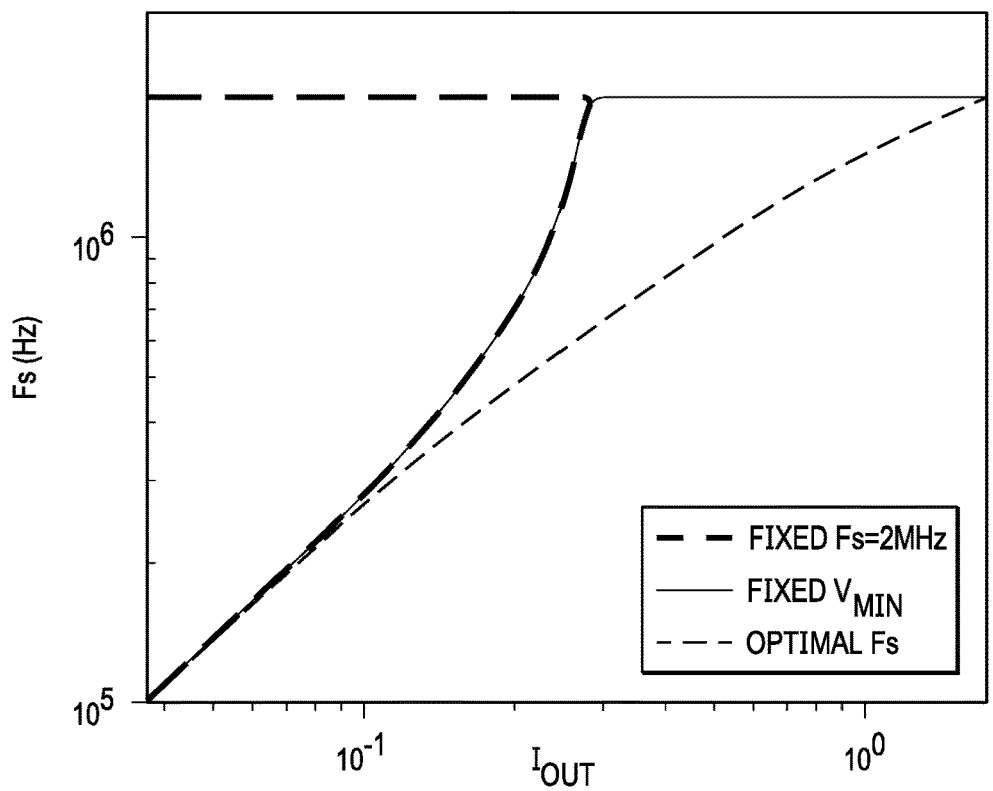
Figure 5D:
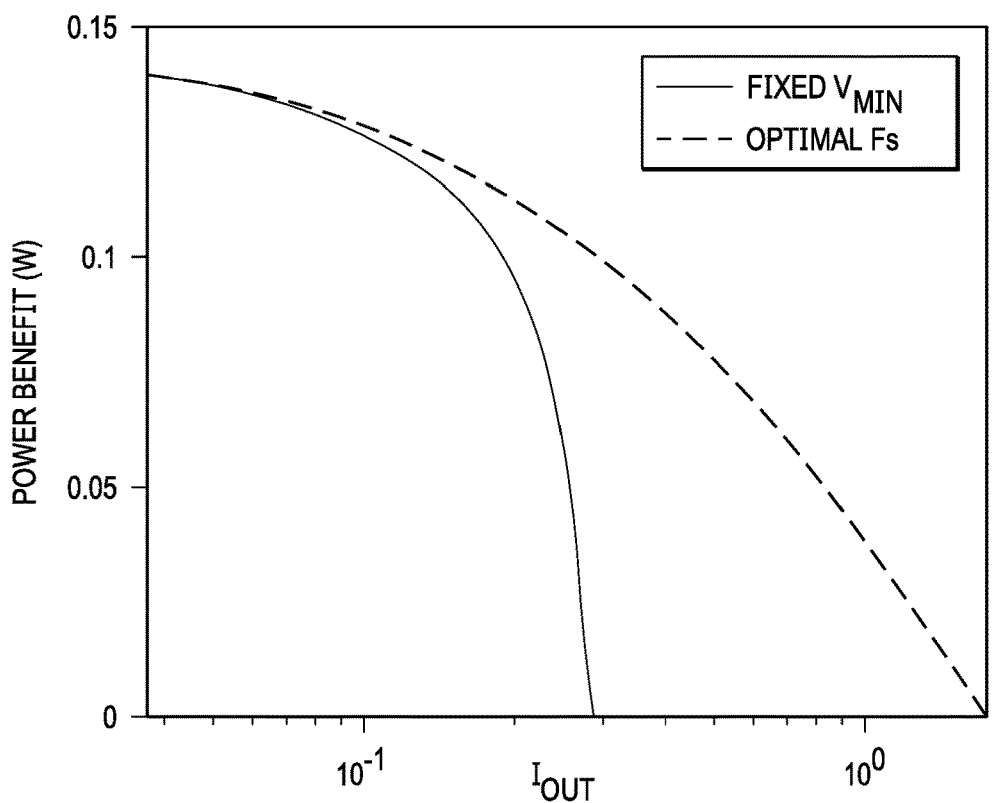

MHz); (b) an optimal switching frequency $F_s$ at which power losses are minimized in charge pump power supply 10; and (c) a fixed minimum voltage $V_{MIN}$ (but constrained at a maximum frequency e.g., $F_s=2$ MHz) set as a threshold to approximate the optimal switching frequency $F_s$. FIG. 5B depicts power efficiency versus output current $I_{OUT}$ for these three cases (a)-(c). FIG. 5C depicts switching frequency $F_s$ versus output current $I_{OUT}$ for these three cases (a)-(c). FIG. 5D depicts a power benefit for the two cases (b) and (c) relative to case (a). The plot of FIG. 5D shows that at lower loads of output current $I_{OUT}$, setting a target minimum voltage $V_{MIN}$ may be effective despite its simplicity. The plot of FIG. 5D also shows that at higher loads of output current $I_{OUT}$, operating at an optimal switching frequency $F_s$ may lead to significantly higher power benefit.

Accordingly, control circuit 20 may be configured to implement a hysteretic control strategy, whereby control circuit 20 may monitor supply voltage $V_{SUPPLY}$ and change switching states of charge pump power supply 10 (e.g., from the transfer phase to the charging phase) when supply voltage $V_{SUPPLY}$ crosses below a target minimum voltage $V_{MIN}$ chosen to optimize switching frequency $F_s$ and power loss. Control circuit 20 may implement one of at least two approaches for choosing target minimum voltage $V_{MIN}$: (a) setting target minimum voltage $V_{MIN}$ to a fixed value, which may approximate the optimized switching frequency $F_s$ at lower loads of current $I_{OUT}$; and (b) varying target minimum voltage $V_{MIN}$ over time, to more closely approximate the optimized switching frequency $F_s$, particularly at medium to high loads of current $I_{OUT}$.

Such approaches may have numerous advantages. For example, such approaches may be simple and fairly easy to implement within control circuit 20, such implementation may be mainly within the digital domain. As another example, these approaches provide an active feedback control which may be independent of amplifier 16, a load coupled at the output of amplifier 16, and battery 12. Moreover, these approaches provide a fast reaction to changes in output current $I_{OUT}$, which may prevent spikes in current that may occur if switching frequency $F_s$ were to change too slowly.

Figure 6:
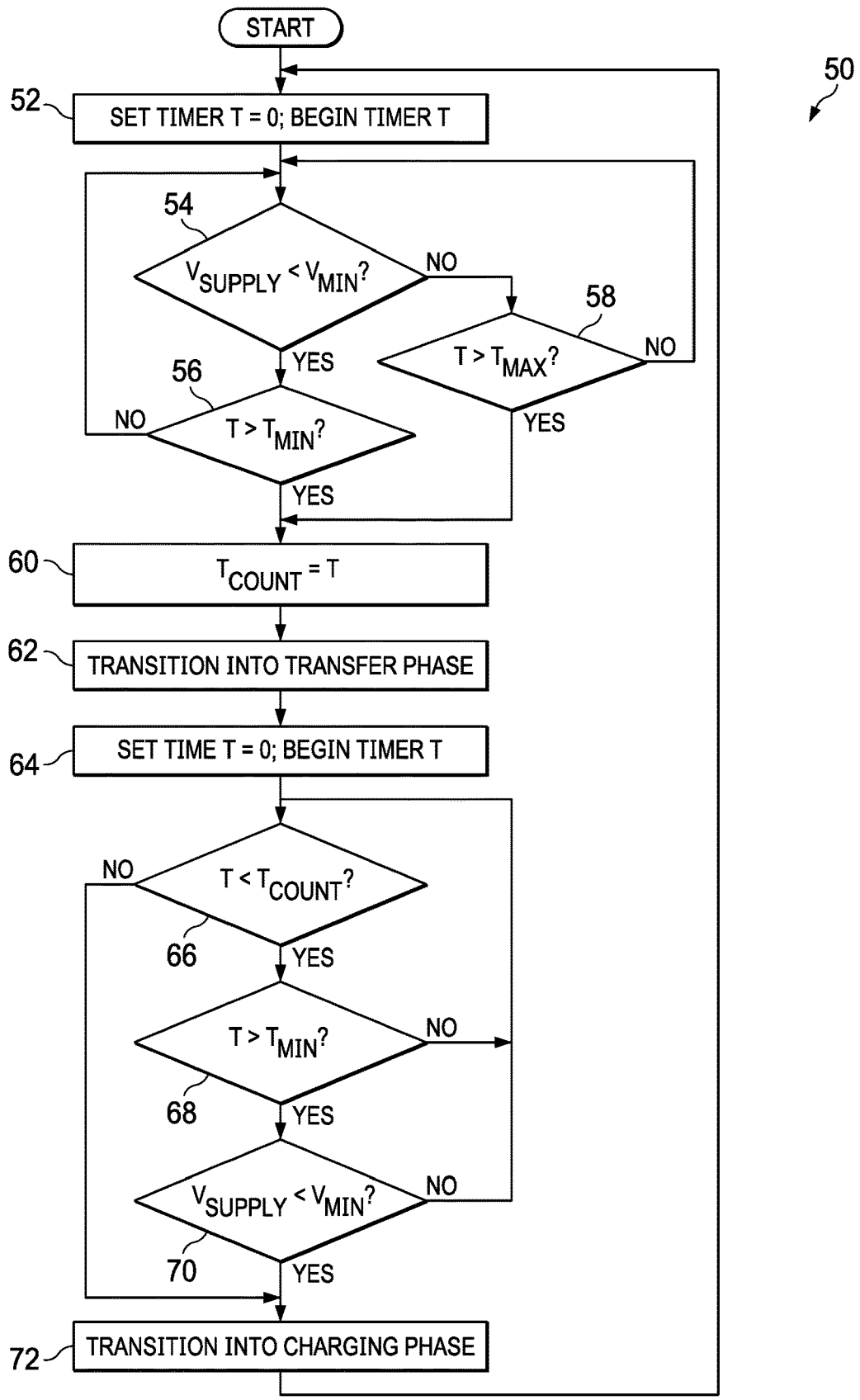
FIG. 6 illustrates a flow chart of an example method for control of switching frequency in a charge pump power supply using a threshold minimum output voltage of the charge pump power supply, in accordance with embodiments of the present disclosure.

FIG. 6 illustrates a flow chart of an example method for control of switching frequency in charge pump power supply 10 using a threshold minimum supply voltage $V_{MIN}$ of charge pump power supply 10, in accordance with embodiments of the present disclosure. According to some embodiments, method 50 may begin at step 52. As noted above, teachings of the present disclosure may be implemented in a variety of configurations of audio IC 9. As such, the preferred initialization point for method 50 and the order of the steps comprising method 50 may depend on the implementation chosen.

At step 52, control circuit 20 may initiate a timer T (e.g., T=0) at the beginning of a charging phase of charge pump power supply 10 and begin the timer. At step 54, control circuit 20 may determine if supply voltage $V_{SUPPLY}$ is less than target minimum voltage $V_{MIN}$. If supply voltage $V_{SUPPLY}$ is less than target minimum voltage $V_{MIN}$, method 50 may proceed to step 56. Otherwise, method 50 may proceed to step 58.

At step 56, in response to supply voltage $V_{SUPPLY}$ being less than target minimum voltage $V_{MIN}$, control circuit 20 may determine whether timer T has exceeded a minimum phase time $T_{MIN}$. The existence of minimum phase time $T_{MIN}$ may in effect place a maximum switching frequency $F_s$ for charge pump power supply 10. If timer T has exceeded minimum phase time $T_{MIN}$, method 50 may proceed to step 60. Otherwise, method 50 may proceed again to step 54.

At step 58, in response to supply voltage $V_{SUPPLY}$ exceeding target minimum voltage $V_{MIN}$, control circuit 20 may determine whether timer T has exceeded a maximum phase time $T_{MAX}$. The existence of maximum phase time $T_{MAX}$ may in effect place a minimum switching frequency $F_s$ for charge pump power supply 10. If timer T has exceeded maximum phase time $T_{MAX}$, method 50 may proceed to step 60. Otherwise, method 50 may proceed again to step 54.

At step 60, control circuit 20 may store the then-current value $T_{COUNT}$ of timer T. As seen below, control circuit 20 may control charge pump power supply 10 using the duration $T_{COUNT}$ such that the duration of a transfer phase is approximately equal to a charging phase which it immediately follows. At step 62, control circuit 20 may cause charge pump power supply 10 to transition into the transfer phase.

At step 64, control circuit 20 may initiate timer T (e.g., T=0) at the beginning of the transfer phase and begin the timer. At step 66, control circuit 20 may determine if timer T is less than the duration $T_{COUNT}$ of the charging phase. If timer T is less than duration $T_{COUNT}$ of the charging phase, method 50 may proceed to step 68. Otherwise, method 50 may proceed to step 72.

At step 68, responsive to timer T being less than the duration $T_{COUNT}$ of the charging phase, control circuit 20 may determine if timer T exceeds minimum phase time $T_{MIN}$. If timer T exceeds minimum phase time $T_{MIN}$, method 50 may proceed to step 70. Otherwise, method 50 may proceed again to step 66.

At step 70, responsive to timer T exceeding minimum phase time $T_{MIN}$, control circuit 20 may determine if supply voltage $V_{SUPPLY}$ is less than target minimum voltage $V_{MIN}$. If supply voltage $V_{SUPPLY}$ is less than target minimum voltage $V_{MIN}$, method 50 may proceed to step 72. Such determination may provide a failsafe determination of undervoltage occurring during the transfer phase.

At step 72, responsive to the duration of the transfer phase meeting that of the preceding charging phase (e.g., as indicated when timer T meets or exceeds duration $T_{COUNT}$) or responsive to an undervoltage condition occurring during the transfer phase (e.g., supply voltage $V_{SUPPLY}$ falls below target minimum voltage $V_{MIN}$ and timer T exceeds minimum phase time $T_{MIN}$), control circuit 20 may cause charge pump power supply 10 to transition into the transfer phase. After completion of step 72, method 50 may proceed again to step 52.

Although FIG. 6 discloses a particular number of steps to be taken with respect to method 50, method 50 may be executed with greater or fewer steps than those depicted in FIG. 6. In addition, although FIG. 6 discloses a certain order of steps to be taken with respect to method 50, the steps comprising method 50 may be completed in any suitable order.

Method 50 may be implemented using control circuit 20 or any other system operable to implement method 50. In certain embodiments, method 50 may be implemented partially or fully in software and/or firmware embodied in computer-readable media.

Notably, when the undervoltage condition occurs during the transfer phase, the subsequent charging phase may last only for minimum phase time $T_{MIN}$, followed by the next transfer phase lasting only for minimum phase time $T_{MIN}$. Thus, when the undervoltage condition occurs during the transfer phase, at least one cycle of operation of charge pump power supply 10 at its maximum frequency may occur.

Figure 7:
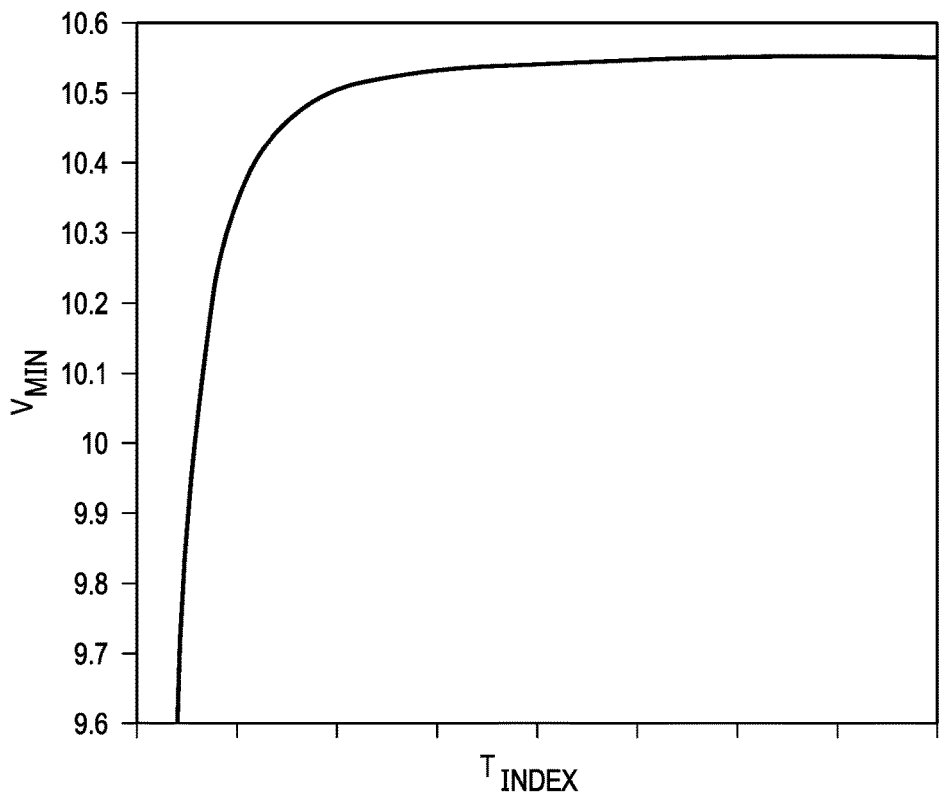
FIG. 7 is an illustration of a graph of an example relationship between a target minimum output voltage generated by a charge pump power supply and a time index, in accordance with embodiments of the present disclosure.

In some embodiments, control circuit 20 may apply a fixed target minimum voltage $V_{MIN}$. In other embodiments, control circuit 20 may apply a variable target minimum voltage $V_{MIN}$. For example, in some embodiments, control circuit 20 may set a time index $T_{INDEX}$ equal to the duration $T_{COUNT}$ recorded during the immediately previous charging phase, and time index $T_{INDEX}$ may be used as an index to calculate or lookup a corresponding target minimum voltage $V_{MIN}$. For example, FIG. 7 is an illustration of a graph of an example relationship between target minimum voltage $V_{MIN}$ and time index $T_{INDEX}$, in accordance with embodiments of the present disclosure. In some embodiments, such relationship may be calculated on characterization and testing to determine an optimum target minimum voltage $V_{MIN}$ as a function of time index $T_{INDEX}$. Thus, in operation, control circuit 20 may use a relationship such as that shown in FIG. 7, either in the form of a lookup table or formula, and determine target minimum voltage $V_{MIN}$ based on time index $T_{INDEX}$ derived from the duration $T_{COUNT}$ recorded during the immediately previous charging phase.

Figure 8A:
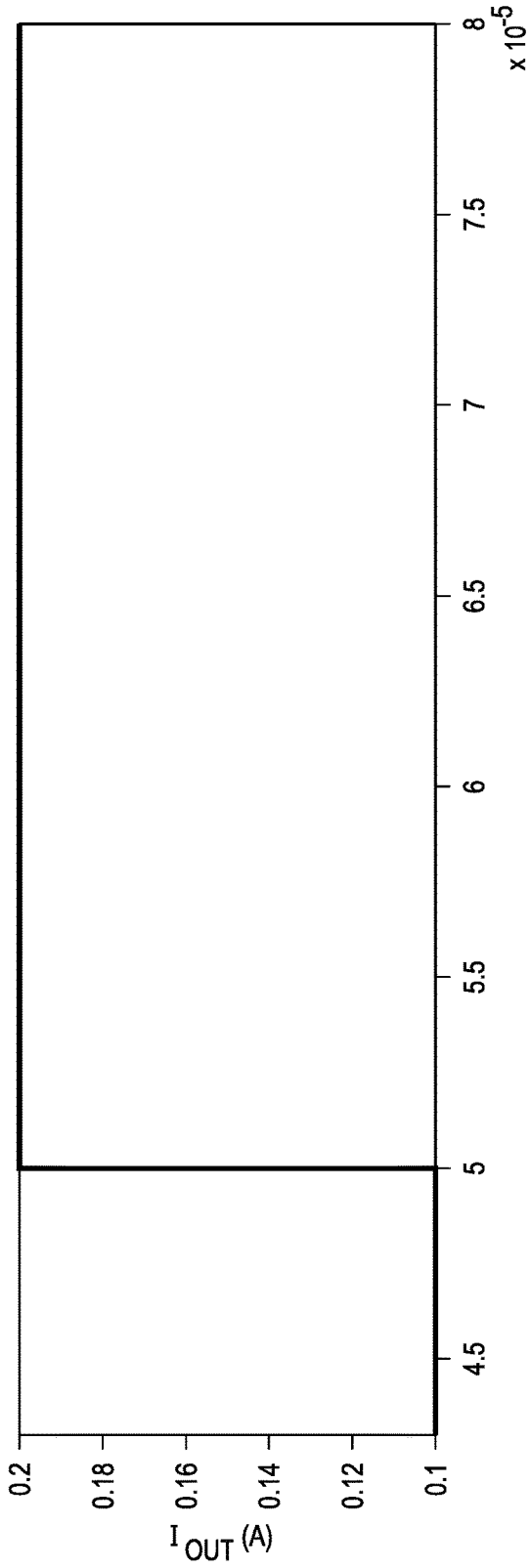
FIGS. 8A, 8B, and 8C are illustrations of graphs of selected waveforms versus time depicting operation of a charge pump power supply in response to a step in load current of the charge pump power supply, in accordance with embodiments of the present disclosure.
Figure 8B:
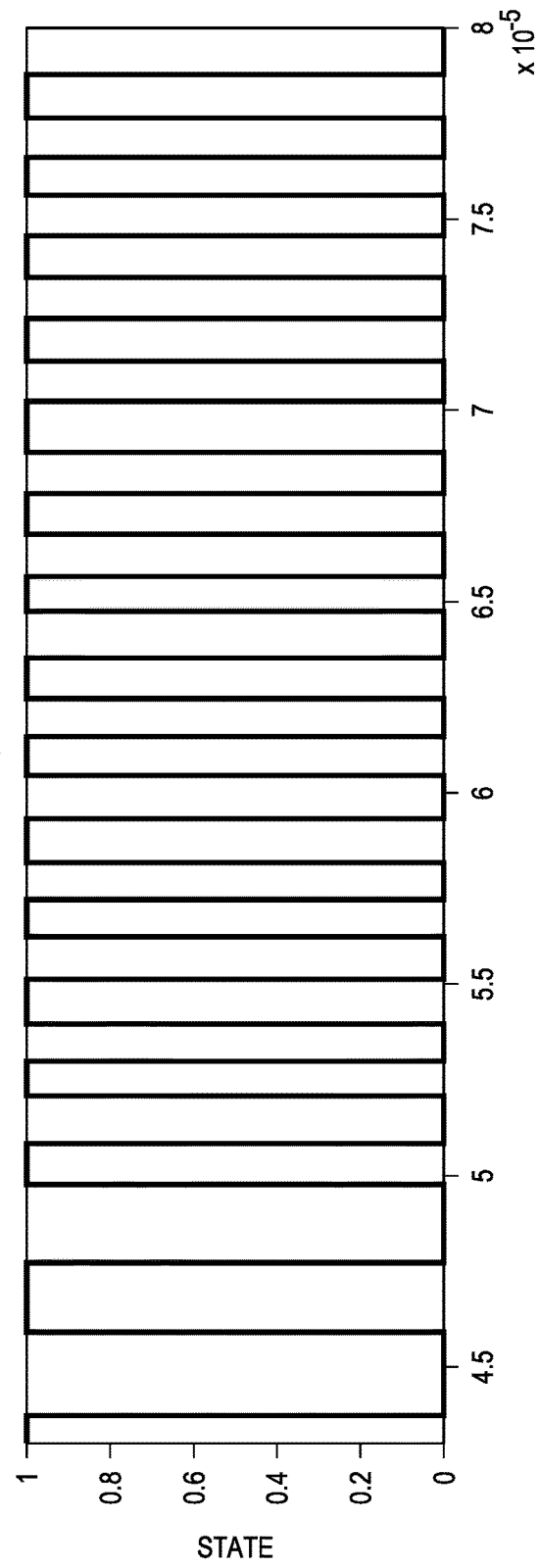
Figure 8C:
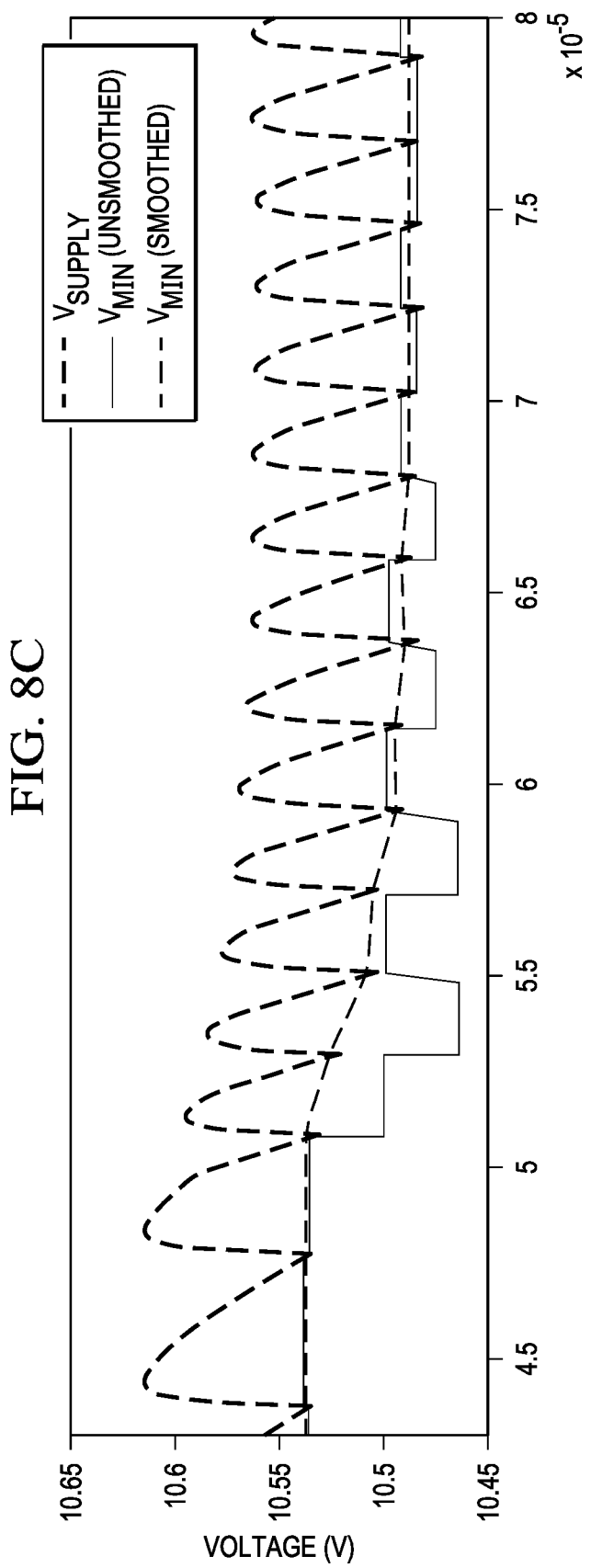

In some embodiments, control circuit 20 may apply filtering to successive determined values of target minimum voltage $V_{MIN}$, in order to smooth the values of target minimum voltage $V_{MIN}$ used. To further illustrate such smoothing, FIGS. 8A-8C are illustrations of graphs of selected waveforms versus time depicting operation of charge pump power supply 10 in response to a step in output current $I_{OUT}$, in accordance with embodiments of the present disclosure. FIG. 8B depicts a switching control signal generated by control circuit 20 (digitized as "0" or "1") over time switching between the transfer phase and charging phase of charge pump power supply 10. FIG. 8C depicts an example waveform for variable target minimum voltage $V_{MIN}$ if left unsmoothed, variable target minimum voltage $V_{MIN}$ if smoothed, and supply voltage $V_{SUPPLY}$ responsive to smoothed variable target minimum voltage $V_{MIN}$ being used for control of charge pump power supply 10.

Under this approach of using variable target minimum voltage $V_{MIN}$, the control loop implemented to determine variable target minimum voltage $V_{MIN}$ may experience instability, even with smoothing of variable target minimum voltage $V_{MIN}$, causing oscillations in switching frequency $F_s$. To overcome this instability, time index $T_{INDEX}$ may be updated continuously based on a then-current value of timer T, and such continuously-updated time index $T_{INDEX}$ may in turn be used to continuously update variable target minimum voltage $V_{MIN}$ during the charging phase. For example, during charging phase, time index $T_{INDEX}$ may be equal to the higher of duration $T_{COUNT}$ recorded during the immediately previous charging phase and the then-current value of timer T. Thus, once timer T exceeds duration $T_{COUNT}$ recorded during the immediately previous charging phase, the value of time index $T_{INDEX}$ may be continuously updated during the remainder of the charging phase, and used to continuously update variable target minimum voltage $V_{MIN}$ during the remainder of the charging phase.

Figure 9:
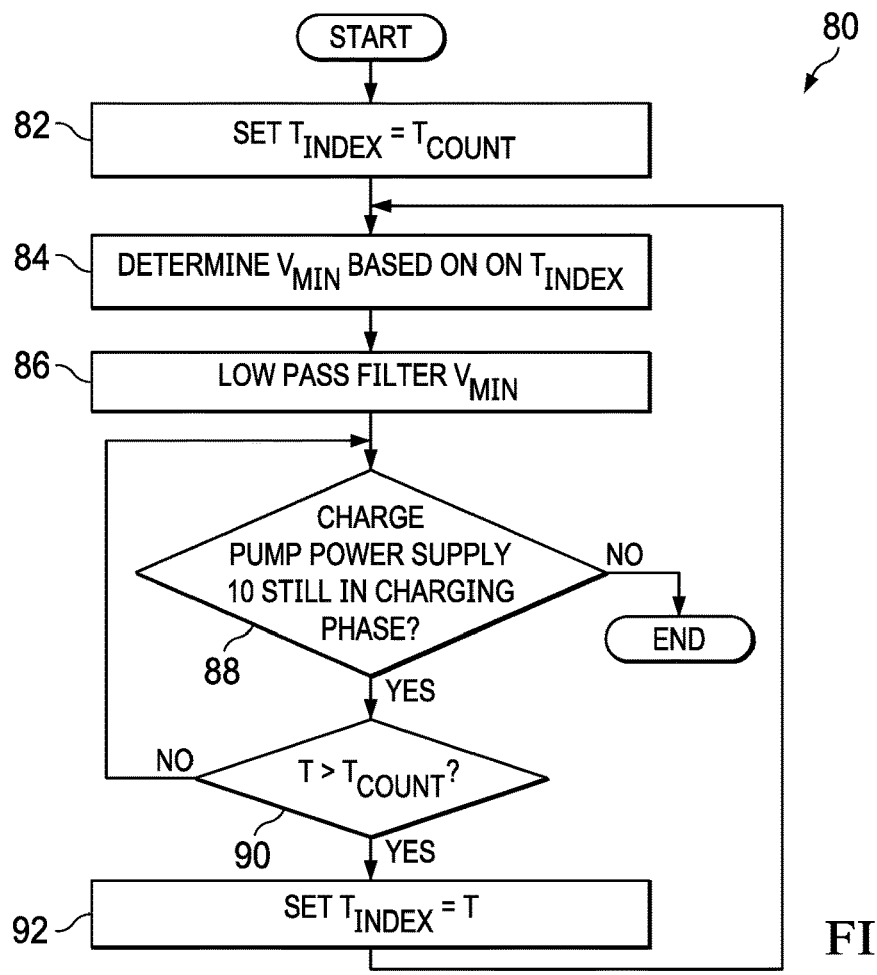
FIG. 9 illustrates a flow chart of an example method for setting a variable target minimum voltage for an output voltage generated by a charge pump power supply, in accordance with embodiments of the present disclosure.

FIG. 9 illustrates a flow chart of an example method 80 for setting a variable target minimum voltage $V_{MIN}$, in accordance with embodiments of the present disclosure.

According to some embodiments, method 80 may begin at step 82. As noted above, teachings of the present disclosure may be implemented in a variety of configurations of audio IC 9. As such, the preferred initialization point for method 80 and the order of the steps comprising method 80 may depend on the implementation chosen.

At step 82, control circuit 20 may, at the beginning of a charging phase, set time index $T_{INDEX}$ equal to duration $T_{COUNT}$ recorded during the immediately previous charging phase. At step 84, control circuit 20 may determine variable target minimum voltage $V_{MIN}$ based on time index $T_{INDEX}$ (e.g., either by calculation or indexed lookup, as described above). At step 86, control circuit 20 may apply filtering to the determined variable target minimum voltage $V_{MIN}$.

At step 88, control circuit 20 may determine if charge pump power supply 10 is still operating in the charging phase. If charge pump power supply 10 is still operating in the charging phase, method 80 may proceed to step 90. Otherwise, method 80 may end.

At step 90, control circuit 20 may determine if the value of timer T exceeds duration $T_{COUNT}$ recorded during the immediately previous charging phase. If timer T exceeds duration $T_{COUNT}$ recorded during the immediately previous charging phase, method 80 may proceed to step 92. Otherwise, method 80 may proceed again to step 88.

At step 92, responsive to the value of timer T exceeding duration $T_{COUNT}$ recorded during the immediately previous charging phase, control circuit 20 may update the value of time index $T_{INDEX}$ equal to the value of timer T. After completion of step 92, method 80 may proceed again to step 84.

Although FIG. 9 discloses a particular number of steps to be taken with respect to method 80, method 80 may be executed with greater or fewer steps than those depicted in FIG. 9. In addition, although FIG. 9 discloses a certain order of steps to be taken with respect to method 80, the steps comprising method 80 may be completed in any suitable order.

Method 80 may be implemented using control circuit 20 or any other system operable to implement method 80. In certain embodiments, method 80 may be implemented partially or fully in software and/or firmware embodied in computer-readable media.

Figure 10:
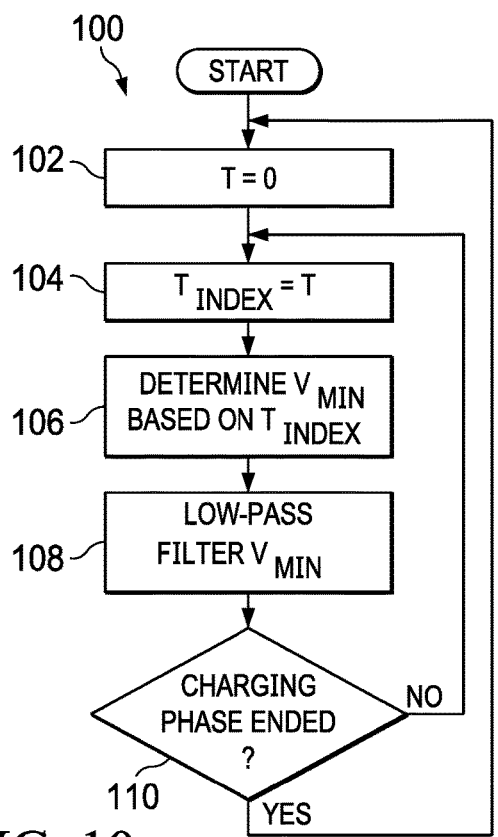
FIG. 10 illustrates a flow chart of an example method for setting a continuously variable target minimum voltage for an output voltage generated by a charge pump power supply, wherein the continuously variable target minimum voltage updates continuously during a charging phase of the charge pump power supply, in accordance with embodiments of the present disclosure.
Figure 11:
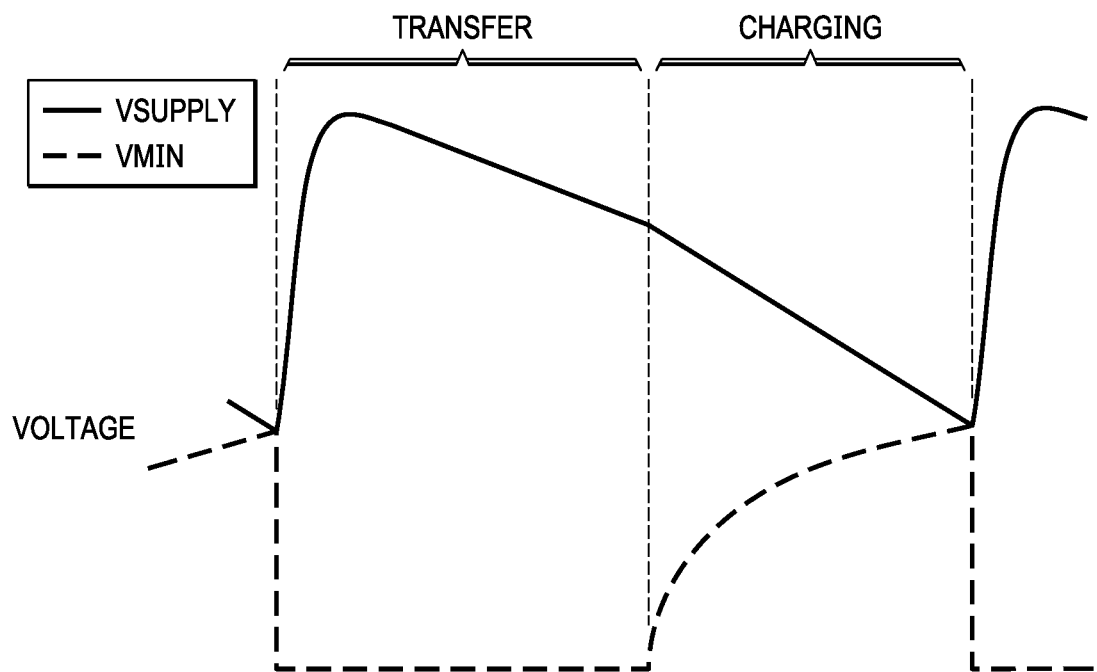
FIG. 11 is an illustration of a graph of an example waveform for a supply voltage and a minimum voltage for the variable target minimum voltage approach described in FIG. 10, in accordance with embodiments of the present disclosure.

FIG. 10 illustrates a flow chart of an example method 100 for setting a continuously variable target minimum voltage for an output voltage generated by a charge pump power supply, wherein the continuously variable target minimum voltage updates continuously during a charging phase of the charge pump power supply, in accordance with embodiments of the present disclosure. FIG. 11 is an illustration of a graph of example waveforms for a supply voltage and a minimum voltage for the variable target minimum voltage approach described by method 100, in accordance with embodiments of the present disclosure.

According to some embodiments, method 100 may begin at step 102. As noted above, teachings of the present disclosure may be implemented in a variety of configurations of audio IC 9. As such, the preferred initialization point for method 100 and the order of the steps comprising method 100 may depend on the implementation chosen.

At step 102, control circuit 20 may, at the beginning of a charging phase, reset a timer T. At step 104, control circuit 20 may update the value of time index $T_{INDEX}$ equal to the value of timer T. At step 106, control circuit 20 may determine variable target minimum voltage $V_{MIN}$ based on time index $T_{INDEX}$ (e.g., either by an analog approach, digital calculation, or indexed lookup, as described above). At step 108, control circuit 20 may apply filtering to the determined variable target minimum voltage $V_{MIN}$, although in some embodiments, control circuit 20 may not apply filtering and step 108 may be omitted. At step 110, control circuit 20 may determine if the charging phase of charge pump power supply 10 has ended. For example, the charging phase may be determined to have ended when supply voltage $V_{SUPPLY}$ is equal to or lesser than variable target minimum voltage $V_{MIN}$. If the charging phase of charge pump power supply 10 has ended, method 100 may proceed again to step 102, such that control circuit 20 determines variable target minimum voltage $V_{MIN}$ for the next charging phase of charge pump power supply 10. Otherwise, method 100 may proceed again to step 104, and variable target minimum voltage $V_{MIN}$ may be again updated in the current switching cycle of charge pump power supply 10 based on the timer T.

Although FIG. 10 discloses a particular number of steps to be taken with respect to method 100, method 100 may be executed with greater or fewer steps than those depicted in FIG. 10. In addition, although FIG. 10 discloses a certain order of steps to be taken with respect to method 100, the steps comprising method 100 may be completed in any suitable order.

Method 100 may be implemented using control circuit 20 or any other system operable to implement method 100. In certain embodiments, method 100 may be implemented partially or fully in software and/or firmware embodied in computer-readable media.

Figure 12:
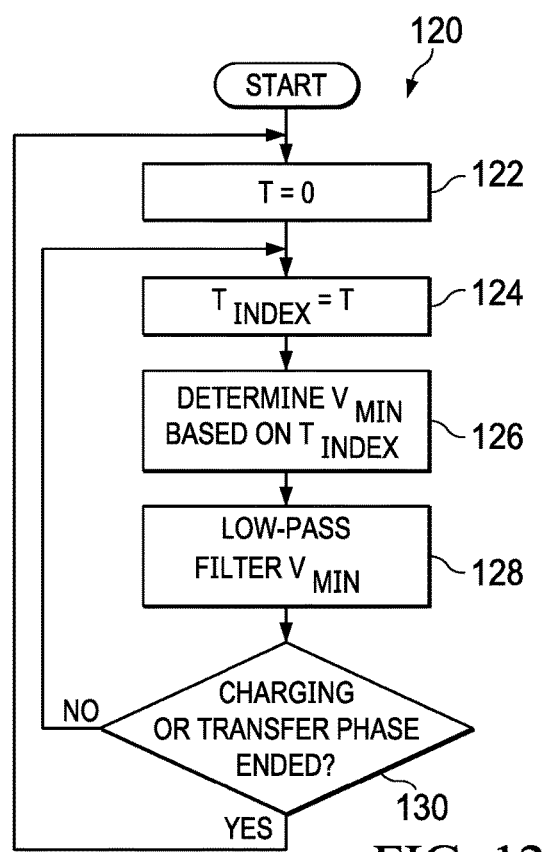
FIG. 12 illustrates a flow chart of an example method for setting a continuously variable target minimum voltage for an output voltage generated by a charge pump power supply, wherein the continuously variable target minimum voltage updates continuously during a charging phase and a transfer phase of the charge pump power supply, in accordance with embodiments of the present disclosure.
Figure 13:
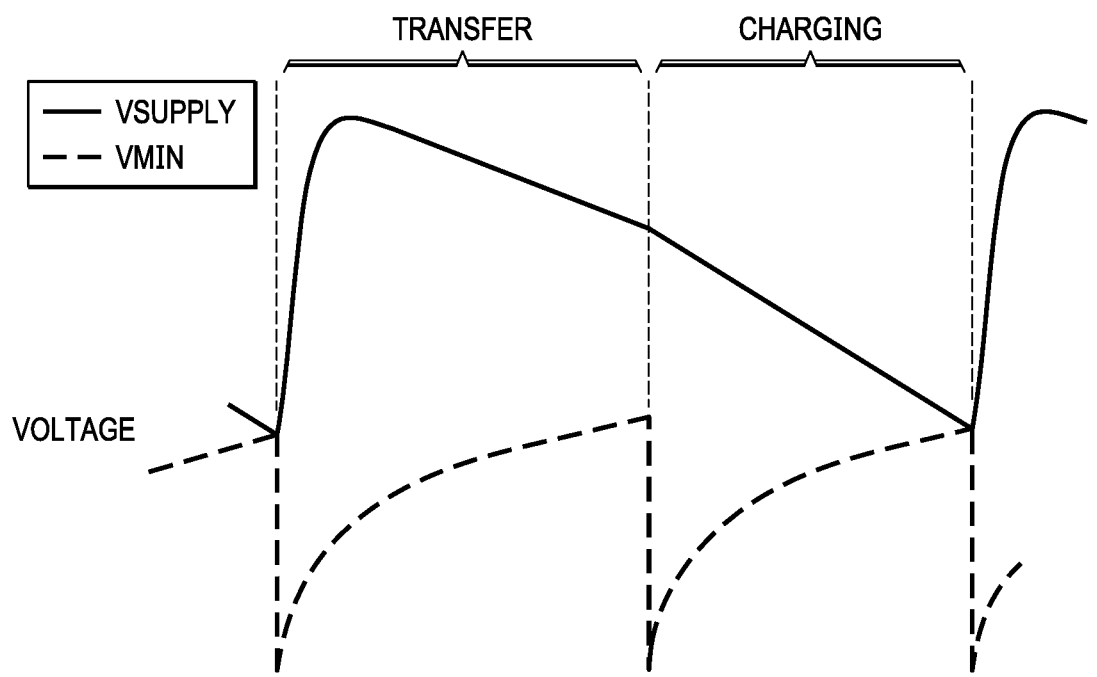
FIG. 13 is an illustration of a graph of an example waveform for a supply voltage and a minimum voltage for the continuously variable target minimum voltage approach described in FIG. 12, in accordance with embodiments of the present disclosure.

FIG. 12 illustrates a flow chart of an example method 120 for setting a continuously variable target minimum voltage for an output voltage generated by a charge pump power supply, wherein the variable target minimum voltage updates continuously during a charging phase and a transfer phase of the charge pump power supply, in accordance with embodiments of the present disclosure. FIG. 13 is an illustration of a graph of example waveforms for a supply voltage and a minimum voltage for the variable target minimum voltage approach described by method 100, in accordance with embodiments of the present disclosure.

At step 122, control circuit 20 may, at the beginning of a charging or transfer phase, reset a timer T. At step 124, control circuit 20 may update the value of time index $T_{INDEX}$ equal to the value of timer T. At step 126, control circuit 20 may determine variable target minimum voltage $V_{MIN}$ based on time index $T_{INDEX}$ (e.g., either by an analog approach, digital calculation, or indexed lookup, as described above). At step 128, control circuit 20 may apply filtering to the determined variable target minimum voltage $V_{MIN}$, although in some embodiments, control circuit 20 may not apply filtering and step 128 may be omitted. At step 130, control circuit 20 may determine if the charging phase or transfer phase of charge pump power supply 10 has ended. If the charging phase or transfer phase of charge pump power supply 10 has ended, method 120 may proceed again to step 122, such that control circuit 20 determines variable target minimum voltage $V_{MIN}$ for the next phase of charge pump power supply 10. Otherwise, method 120 may proceed again to step 124, and variable target minimum voltage $V_{MIN}$ may be again updated in the current phase of charge pump power supply 10 based on the timer T.

Although FIG. 12 discloses a particular number of steps to be taken with respect to method 120, method 120 may be executed with greater or fewer steps than those depicted in FIG. 12. In addition, although FIG. 12 discloses a certain order of steps to be taken with respect to method 120, the steps comprising method 120 may be completed in any suitable order.

Method 120 may be implemented using control circuit 20 or any other system operable to implement method 120. In certain embodiments, method 120 may be implemented partially or fully in software and/or firmware embodied in computer-readable media.

The approach of using continuously variable target minimum voltage $V_{MIN}$ as described above in reference to FIGS. 10-13 may be analogous to slope compensation used in certain types of inductive switching converter architectures, such as current-mode control (CMC) and constant-on time (COT) converter architectures. Slope compensation traditionally adds a continuously changing reference to two quantities being compared during either part of or a full switching cycle. For example, for CMC architectures, the quantities being compared may be a power converter inductor current versus a current control reference. For COT architectures, the quantities compared may be an output voltage of a power converter versus a voltage control reference. Similarly, the approach of using a continuously variable target minimum voltage $V_{MIN}$ as described above in reference to FIGS. 10-13 may compare supply voltage $V_{SUPPLY}$ to variable target minimum voltage $V_{MIN}$ which may continuously vary during a switching cycle.

In some embodiments, the slope profile for generating variable target minimum voltage $V_{MIN}$ shown in FIG. 7, or implemented in method 100 of FIG. 10 or method 120 of FIG. 12, may be entirely in the analog domain. For instance, such implementation may use a current source into a resistive-capacitive network for generating variable target minimum voltage $V_{MIN}$ as a function of time with a comparator for detecting when a charging phase has ended. Alternatively, in some embodiments, the slope profile for generating variable target minimum voltage $V_{MIN}$ may be implemented in the digital domain (for example by digitizing supply voltage $V_{SUPPLY}$ and implementing method 100 or method 120 with digital logic).

Although the foregoing discussion of a target minimum voltage $V_{MIN}$ enables frequency control of charge pump power supply 10, in some embodiments, control circuit 20 may also be configured to jointly control frequency and duty cycle of charge pump power supply 10. Under this approach, when control circuit 20 determines that frequency may be reduced by detecting that target minimum voltage $V_{MIN}$ is not being crossed during a switching cycle, control circuit 20 may first reduce the frequency while maintaining a 50% duty cycle until the charging phase begins to fully settle. Control circuit 20 may determine whether settling has occurred using a comparator or a register to set a certain number of switching cycles to be the fully-settled amount of time. After such threshold or time value is reached, if target minimum voltage $V_{MIN}$ is still not being crossed, then control circuit 20 may allot additional time to the transfer phase of charge pump power supply 10, in order to simultaneously increase duty cycle and reduce frequency of charge pump power supply 10.

To control duty cycle and frequency, control circuit 20 may operate similarly to the operation described above for controlling only frequency of charge pump power supply 10. For example, as discussed above, control circuit 20 may implement a timer that defines a total time for both the charging and transfer phases of charge pump power supply 10. However, for duty cycle control, control circuit 20 may implement another timer that resets at the start of each transfer phase and runs until the end of the subsequent charging phase. If, during any given transfer/charging sequence, supply voltage $V_{SUPPLY}$ decreases below target minimum voltage $V_{MIN}$ at a value of the second time that is less than a value of the second timer for the previous transfer/charging sequence, control circuit 20 may modify the duration of the subsequent transfer/charging sequence.

For example, if supply voltage $V_{SUPPLY}$ decreases below target minimum voltage $V_{MIN}$ during a charging phase, control circuit 20 may immediately end the charging phase and switch to the next transfer phase. If the duty cycle of the switching cycle is then greater than 50%, control circuit 20 may subtract the time difference between the current switching cycle and the previous switching cycle from the next transfer phase. However, if such subtraction results in a duty cycle of less than 50% for the next switching cycle, then control circuit 20 may divide the extra time difference between the transfer and charging phases. If the duty cycle has already reached 50% at the time $V_{SUPPLY}$ decreases below target minimum voltage $V_{MIN}$, then control circuit 20 may subtract half the time difference between the current switching cycle and the previous switching cycle from the next charging phase.

As another example, if supply voltage $V_{SUPPLY}$ decreases below target minimum voltage $V_{MIN}$ during a transfer phase, control circuit 20 may immediately end the transfer phase, switch to the next charging phase, and run the charging phase for the same amount of time as the previous charging phase. Control circuit 20 may then reduce the subsequent transfer phase using the rules described above for supply voltage $V_{SUPPLY}$ decreasing below target minimum voltage $V_{MIN}$ during the charging phase.

In either case, control circuit 20 may apply programmable phase and sequence duration minimum and maximum settings in order to place bounds on minimum and maximum switching frequency and minimum and maximum duty cycle for charge pump power supply 10.

Figure 14:
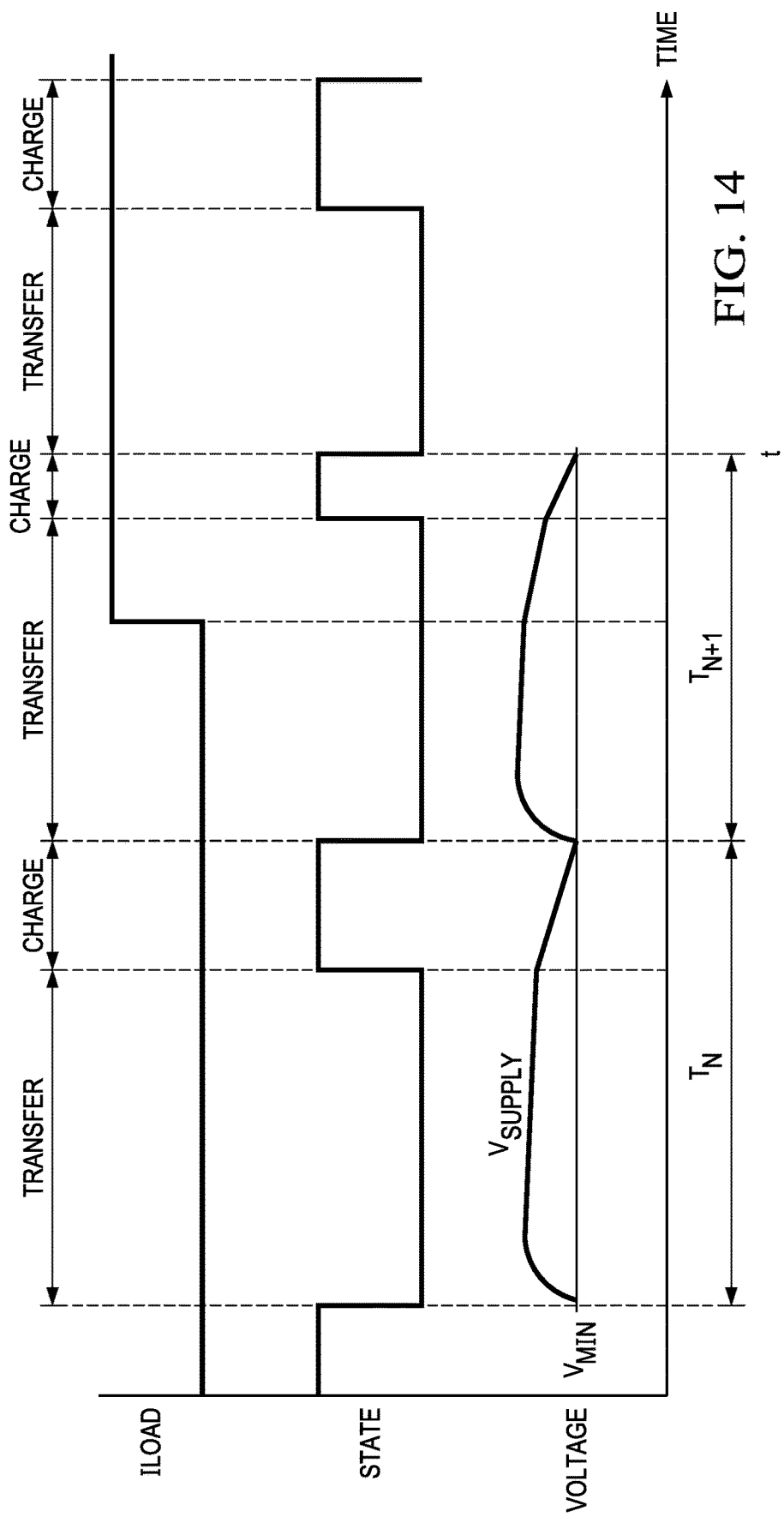
FIG. 14 is an illustration of graphs of selected waveforms versus time depicting operation of a charge pump power supply having frequency and duty cycle control, in accordance with embodiments of the present disclosure.

The combined frequency and duty cycle control scheme may be further illustrated in FIG. 14. FIG. 14 is an illustration of graphs of selected waveforms versus time depicting operation of charge pump power supply 10 having frequency and duty cycle control, in accordance with embodiments of the present disclosure. As seen in FIG. 14, at a time t during a charging phase of charge pump power supply 10, supply voltage $V_{SUPPLY}$ may decrease below target minimum voltage $V_{MIN}$. Accordingly, control circuit 20 may determine a duration of time $T_{n+1}$ of the current switching cycle and a difference $T_n - T_{n+1}$ between the current switching cycle and the previous switching cycle ($T_n$), and subtract such difference from the subsequent transfer phase.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for operating a charge pump having a variable switching frequency, comprising:
   comparing a target minimum output voltage with an output voltage generated at an output of the charge pump, wherein the target minimum output voltage is set based on a duration of a charging phase of a switching cycle of the charge pump; and
   controlling switching of switches of the charge pump based on the comparison such that the variable switching frequency varies as an output current driven by the charge pump varies.

2. The method of claim 1, wherein the target minimum output voltage is a fixed value.

3. The method of claim 1, wherein the target minimum output voltage varies in order that the charge pump operates at a switching frequency at which power losses of the charge pump are minimized.

4. The method of claim 1, wherein the target minimum output voltage is set based on a duration of a charging phase of a previous switching cycle of the charge pump.

5. The method of claim 4, further comprising updating the target minimum output voltage from a value set based on the duration during a present charging phase of the charge pump.

6. The method of claim 1, wherein the target minimum output voltage is set based on a duration of a current switching cycle of the charge pump.

7. The method of claim 6, wherein the target minimum output voltage is set during a charging phase of the charge pump based on a duration of the charging phase.

8. The method of claim 6, wherein the target minimum output voltage is set during each of a charging phase and a transfer phase of the charge pump based on a duration of the charging phase when set during the charging phase and based on a duration of the transfer phase when set during the transfer phase.

9. The method of claim 1, further comprising:
determining a difference in times between a duration of a previous switching cycle and a duration that a current switching cycle required for the output voltage to decrease below the target voltage; and
controlling switching of switches of the charge pump based on the difference such that a duty cycle of the charge pump varies as the output current driven by the charge pump varies.

10. A system for operating a charge pump having a variable switching frequency, comprising:
an input configured to receive a signal indicative of an output voltage generated at an output of the charge pump; and
a control circuit configured to:
compare a target minimum output voltage with the output voltage generated at the output of the charge pump, wherein the target minimum output voltage is set based on a duration of a charging phase of a switching cycle of the charge pump; and
control switching of switches of the charge pump based on the comparison such that the variable switching frequency varies as an output current driven by the charge pump varies.

11. The system of claim 10, wherein the target minimum output voltage is a fixed value.

12. The system of claim 10, wherein the target minimum output voltage varies in order that the charge pump operates at a switching frequency at which power losses of the charge pump are minimized.

13. The system of claim 10, wherein the target minimum output voltage is set based on a duration of a charging phase of a previous switching cycle of the charge pump.

14. The system of claim 13, wherein the control circuit is further configured to update the target minimum output voltage from a value set based on the duration during a present charging phase of the charge pump.

15. The system of claim 10, wherein the target minimum output voltage is set based on a duration of a current switching cycle of the charge pump.

16. The system of claim 15, wherein the target minimum output voltage is set during a charging phase of the charge pump based on a duration of the charging phase.

17. The system of claim 15, wherein the target minimum output voltage is set during each of a charging phase and a transfer phase of the charge pump based on a duration of the charging phase when set during the charging phase and based on a duration of the transfer phase when set during the transfer phase.

18. The system of claim 10, wherein the control circuit is further configured to:
determine a difference in times between a duration of a previous switching cycle and a duration that a current switching cycle required for the output voltage to decrease below the target voltage; and
control switching of switches of the charge pump based on the difference such that a duty cycle of the charge pump varies as the output current driven by the charge pump varies.

19. A device comprising:
a charge pump having a variable switching frequency; and
a control circuit configured to:
compare a target minimum output voltage with an output voltage generated at an output of the charge pump, wherein the target minimum output voltage is set based on a duration of a charging phase of a switching cycle of the charge pump; and
control switching of switches of the charge pump based on the comparison such that the variable switching frequency varies as an output current driven by the charge pump varies.

\* \* \* \* \*